(12) United States Patent
Ooi et al.

(10) Patent No.: US 11,158,763 B2
(45) Date of Patent: Oct. 26, 2021

(54) INTEGRATION OF III-NITRIDE NANOWIRE ON TRANSPARENT CONDUCTIVE SUBSTRATES FOR OPTOELECTRONIC AND ELECTRONIC DEVICES

(71) Applicant: King Abdullah University of Science and Technology, Thuwal (SA)

(72) Inventors: Boon S. Ooi, Thuwal (SA); Aditya Prabaswara, Thuwal (SA); Bilal Janjua, Thuwal (SA); Tien Khee Ng, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/838,299

(22) Filed: Apr. 2, 2020

(65) Prior Publication Data
US 2020/0259047 A1    Aug. 13, 2020

Related U.S. Application Data

(62) Division of application No. 15/906,694, filed on Feb. 27, 2018, now Pat. No. 10,651,343.
(Continued)

(51) Int. Cl.
*H01L 33/24*    (2010.01)
*H01L 33/00*    (2010.01)
(Continued)

(52) U.S. Cl.
CPC ............ *H01L 33/24* (2013.01); *H01L 33/007* (2013.01); *H01L 33/0025* (2013.01);
(Continued)

(58) Field of Classification Search
CPC ......... H01L 33/24; H01L 33/40; H01L 33/16; H01L 33/0025; H01L 33/06;
(Continued)

(56) References Cited

U.S. PATENT DOCUMENTS 5,403,916 A    4/1995 Watanabe et al.
5,458,612 A    10/1995 Chin et al.
(Continued)

OTHER PUBLICATIONS

Asahi, et al., "Very strong photoluminescence emission from GaN grown on amorphous silica substrate by gas source MBE", Journal of Crystal Growth 201/202 (1999) 371-375.
(Continued)

*Primary Examiner* — Patricia D Reddington
(74) *Attorney, Agent, or Firm* — Billion & Armitage

(57) ABSTRACT

A dislocation-free GaN/InGaN-based nanowires-LED epitaxially grown on a transparent, electrically conductive template substrate. The simultaneous transparency and conductivity are provided by a thin, translucent metal contact integrated with a quartz substrate. The light transmission properties of the translucent metal contact are tunable during epitaxial growth of the nanowires LED. Transparent light emitting diodes (LED) devices, optical circuits, solar cells, touch screen displays, and integrated photonic circuits can be implemented using the current platform.

16 Claims, 4 Drawing Sheets

Related U.S. Application Data

(60) Provisional application No. 62/464,461, filed on Feb. 28, 2017.

(51) Int. Cl.

| | |
|---|---|
| H01L 33/06 | (2010.01) |
| H01L 33/08 | (2010.01) |
| H01L 33/42 | (2010.01) |
| H01L 33/40 | (2010.01) |
| H01L 33/16 | (2010.01) |
| H01L 33/32 | (2010.01) |
| H01L 33/38 | (2010.01) |
| H01L 33/62 | (2010.01) |
| H01L 33/18 | (2010.01) |

(52) U.S. Cl.
CPC ............ *H01L 33/06* (2013.01); *H01L 33/08* (2013.01); *H01L 33/16* (2013.01); *H01L 33/40* (2013.01); *H01L 33/42* (2013.01); *H01L 33/0075* (2013.01); *H01L 33/18* (2013.01); *H01L 33/32* (2013.01); *H01L 33/385* (2013.01); *H01L 33/62* (2013.01); *H01L 2933/0016* (2013.01); *H01L 2933/0066* (2013.01)

(58) Field of Classification Search
CPC ....... H01L 33/007; H01L 33/08; H01L 33/42; H01L 2933/0066; H01L 33/62; H01L 33/32; H01L 33/385; H01L 2933/0016; H01L 33/0075; H01L 33/18
See application file for complete search history.

(56) References Cited

U.S. PATENT DOCUMENTS

| | | | |
|---|---|---|---|
| 7,061,065 | B2 | 6/2006 | Horng et al. |
| 9,142,722 | B2 | 9/2015 | Kim et al. |
| 9,184,343 | B2 | 11/2015 | Yoo et al. |
| 2003/0168964 | A1* | 9/2003 | Chen ........................ H01L 33/20 313/495 |
| 2006/0027884 | A1 | 12/2006 | Chen |
| 2009/0104455 | A1 | 4/2009 | Chen et al. |
| 2009/0136754 | A1* | 5/2009 | Rao .......................... C03C 17/42 428/375 |
| 2012/0153252 | A1 | 6/2012 | Kim et al. |
| 2012/0280612 | A1* | 11/2012 | Lee ....................... H01L 51/5281 313/504 |
| 2013/0112944 | A1 | 5/2013 | Cha et al. |
| 2014/0345681 | A1* | 11/2014 | Yoshida ............ H01L 31/06875 136/255 |
| 2015/0236342 | A1 | 8/2015 | Rojeski |
| 2019/0157505 | A1* | 5/2019 | Even ..................... H01L 33/145 |

OTHER PUBLICATIONS

Bour, et al., "Polycrystalline nitride semiconductor light-emitting diodes fabricated on quartz substrates", Applied physics letters, vol. 76, No. 16, Apr. 17, 2000, pp. 2182-2184.
Brouquin, et al., "Glass Integrated optics: state of the art and position towards other technologies", Proc. of SPIE vol. 6475, 647507-1-13, downloaded from http://proceedings.spiedigitallibrary.org/ on Aug. 17, 2016.
Chen, et al., "Optical waveguides in crystalline dielectric materials produced by femtosecond-laser micromachining", Laser photonics Rev. 8, No. 2, 251-275 (2014) /DOI 10.1002/lpor.201300025.
Choi, et al., "Nearly single-crystalline GaN light-emitting diodes on amorphous glass substrates", Nature Photonics, vol. 5, Dec. 2011, pp. 763-769.
Eaton, et al., "Femtosecond laser micromachining for the realization of fully integrated photonic and microfluidic devices", Proc. of SPIE vol. 9365 936515-1 Downloaded From: http://proceedings.spiedigitallibrary.org/ on Jun. 12, 2016.
Friberg, et al., "Nonlinear Optical Glasses for Ultrafast Optical Switches", IEEE Journal of Quantum Electonics, vol. QE-23, No. 12, Dec. 1987, pp. 2089-2094.
Hayashi, et al., "Self-organization of dislocation-free, high-density, vertically aligned GaN nanocolumns involving InGaN quantum wells on graphene/SiO2 covered with a thin AlN buffer layer", Nanotechnology 27 (2016) 055302, 7 pages, Dec. 16, 2015.
Heck, et al., "Hybrid Silicon Photonic Integrated Circuit Technology", IEEE Journal of Selected Topics in Quantum Electronics, vol. 19, No. 4, Jul./Aug. 2013, 17 pages.
Heck, et al., "Ultra-low loss wavelength guide platform and its integration with silicon photonics", Laser Photonics Rev. 8, No. 5, 667-686 (2014) / DOI 10.1002/lpor.201300183.
Huang, et al., "Sub-micron silicon nitride wavelength fabrication using conventional optical lithography", Optics Express 6781, vol. 23, No. 5, DOI: 10.1364/OE23.006780, Mar. 9, 2015, 7 pages.
Kapoor, et al., "Solid State Yellow and Orange Lasers for Flow Cytometry", Cytometry Part A, 73A: 570-577, 2008.
Kikuchi, et al., "InGaN/GaN Multiple Quantum Disk Nanocolumn Light-Emitting Diodes Grown on (111) Si Substrate", Jpn. J. Appl. Phys., 43., Nov. 5, 2004, 1524-1526.
Kim, et al., "Monolithically Integrated InGaAs Nanowires on 3D Structured Silicon-on-Insulator as a New Platform for Full Optical Links", Nano Lett. 2016, 16, 1833-1839.
Kim, et al., "Room-teperature photoluminescence and electroluminescence properties of sputter-grown gallium nitride doped with europium", Journal of Applied Physics 95, 4787 (2004); doi: 10.1063/1.1652226.
Komljenovic, et al., "Heterogeneous Silicon Photonic Integrated Circuits", Journal of Lightwave Technology, vol. 34, No. 1, Jan. 1, 2016, p. 20-35.
Kumaresan, et al., "Self-induced growth of vertical GaN nanowired on silica", Nanotechnology 27 (2016) 135602, 8 pages, Feb. 22, 2016.
Rajkanan, et al., "Absorption Coefficient of Silicon for Solar Cell Calculcations".
Romero-Garcia, et al., "Silicon nitride comos-compatible platform for integrated photonics applications at visible wavelengths", Optics Express, vol. 21, No. 12, DOI:10.1364/OE.21.014036, Jun. 17, 2013, 11 pages.
Shon, et al., "Fabrication of full-color InGaN-based light-emitting diodes on amorphous substrates by pulsed sputtering", Scientific Reports, 4:5325, DOI: 10.1038/srep05325, published Jun. 23, 2014, pp. 1-4.
Sugioka, et al., "Femtosecond laser 3D micromachining: a powerful tool for the fabrication of microfluidic, optofluidic, and electrofluidic devices based on glass", Lab Chip, 2014, 14, 3447.
Telford, "Small Lasers in Flow Cytometry", Methods in Molecular Biology: Flow Cytometry Protocols, 2nd ed. p. 399-418.
Uchida, et al., "Epitaxial Growth of GaN Layers on Metallic TiN Buffer Layers", Journal of Electronic Materials, vol. 35, No. 10, 2006, 1806-1811.
Xie, et al., "Fabrication and characterization of on-chip silicon nitride microdisk integrated with colloidal quantum dots", Optics Express A114, vol. 24, No. 2, Jan. 25, 2016, 9 pages.
Xie, et al., "Low-loss silicon nitride wavelength hybridly integrated with colloidal quantum dots", Optics Express 12152, vol. 23, No. 9, May 4, 2014, DOI:10.1364/OE13.012152.
Zhao, et al., "Growth of large-scale vertically aligned GaN nanowires and their heterostructures with high uniformity on SiOx by catalyst-free molecular beam epitaxy", Nanoscale, 2013, 5, 5283-5287.

* cited by examiner

Process flow for nanowire growth.

Process flow for light emitting diode fabrication.

INTEGRATION OF III-NITRIDE NANOWIRE ON TRANSPARENT CONDUCTIVE SUBSTRATES FOR OPTOELECTRONIC AND ELECTRONIC DEVICES

BACKGROUND

Optoelectronic components operating in the visible wavelength and integrated upon quartz substrates are advantageous due to device transparency, availability of a mature glass processing technology, the potential for scalability, and the ability to withstand relatively high processing temperature up to 1.000° C. Beyond lighting, integrated light emitters on quartz pave the way for diverse applications crossing multiple disciplines, such as integrated optofluidics devices, and integrated photonics by bonding the quartz based device wafer onto microfluidic and CMOS wafers. Passive waveguiding structure compatible with glass have been demonstrated, including using silicon nitride based structures and femtosecond laser micromachining. By utilizing nonlinearity effects on glass it is possible to implement functions such as optical switching. Thus, the quartz platform is highly attractive for cross disciplinary scientific purposes. Another added advantage is ease of implementation of such integrated optoelectronics due to the widespread use of glass in commercial lighting system and electronic devices.

There have been several attempts to grow III-Nitride materials on top of glass based substrates. Previously, GaN deposition on glass utilizing gas source molecular beam epitaxy (MBE) and have resulted in polycrystalline material quality which affects device performance. Others have demonstrated the capability of growing nearly single crystalline GaN micro-pyramids on top of glass by micromasking and subsequent selective metal organic chemical vapor deposition (MOCVD) growth within the holes. However, the excessive indium evaporation in metal organic chemical vapor deposition prevents efficient incorporation of indium for achieving emitters in the green gap. Yet others have demonstrated improvements in the quality of sputtered InGaN thin film on top of amorphous glass using graphene as a pre-orienting buffer layer, effectively suppressing a defect-related photoluminescence peak. Still, these methods require complex processing steps which hinder the possibility of integrating them into cost-effective manufacturing processes.

Unlike planar or micrometer-size semiconductor epitaxy growth, plasma-assisted MBE-grown self-assembled group III-Nitride nanowires materials can be grown on surfaces with disparate lattice constant or crystal structure, and still be dislocation-free in the active region. These nanowire materials are typically grown catalyst-free using plasma assisted molecular beam epitaxy (PAMBE) without the need for epitaxial lattice-, thermal-, or crystal-structure-matching with the substrate. In addition to good crystal quality, nanowire-based III-Nitride materials can also cover UV, visible, and IR wavelengths by changing the ternary compound composition, making them attractive for various applications. Furthermore, their reduced piezoelectric polarization and elastic strain enable high quantum efficiency even within the green gap.

SUMMARY

By directly integrating InGaN-based nanowire structures on a transparent substrate and leveraging existing silica photonic technologies, the present disclosure seeks to overcome previous limitations and accelerate the development of various applications such as back lighting units, integrated optofluidic devices, photonic integrated circuits, optogenetics devices, solid state lighting, lab-on-a-chip, piezophototronic sensors, and quantum computers.

Embodiments of the present disclosure describe an exemplary light emitting diode (LED) delivering visible wavelength light for various applications such as consumer display units, solid state lighting, visible light communication, integrated optofluidic devices, flow cytometry, and optogenetics. The availability of an electrically-pumped, highly efficient light source monolithically integrated with a glass substrate enables fabrication of a compact, functional, and fully integrated visible-light device.

Additional embodiments describe GaN/InGaN-based nanowires on transparent conducting substrates or template substrates having the same morphological nature, but better conductive properties than non-conducting or existing non-transparent substrates. Transparent optoelectronic applications can also be realized.

Embodiments of the present invention also involve the fabrication of transparent light emitting devices using an InGaN quantum disks-based nanowires heterostructure. The realization of such devices can pave the way for novel transparent optoelectronic devices. An exemplary case growing nanowires on semi-transparent, conductive-thin-film on a transparent substrate is described for lighting and optical communication applications. Transparent quartz substrates also have the added advantage of scalability and direct integration with existing consumer devices compared to conventional substrates currently used for light emitter fabrication.

This disclosure further teaches lasers, photodetectors, solar cells, and photonic integrated circuits comprising components such as a light emitter, a passive waveguiding component, a light detector, and nonlinear switching components. Other uses include compact, efficient, and transparent light emitting devices, LCD backlighting unit, indoor lighting unit, outdoor lighting unit, portable lighting unit, touchscreen display, pressure sensor, optical processors, quantum computing, optical circuit processing, transparent piezo sensor, integrated energy generators, integrated optofluidics devices, integrated lab-on-chip devices.

BRIEF DESCRIPTION OF DRAWINGS

This written disclosure describes illustrative embodiments that are non-limiting and non-exhaustive. In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

Reference is made to illustrative embodiments that are depicted in the figures, in which.

DETAILED DESCRIPTION

One embodiment of the present disclosure describes growth and fabrication of a single crystalline GaN/InGaN nanowires (NW)-based light emitting diode (LED) on top of a transparent quartz substrate. The NW structure was grown using plasma-assisted molecular beam epitaxy (PA-MBE), and the LED was fabricated using standard foundry-compatible microfabrication technique. The device operates with a peak wavelength of 590 nm and exhibits a low turn-on voltage of 2.4 V. Display and lighting technologies can be advanced by enabling the fabrication of an integrated light source on such transparent substrates.

Figure 1:
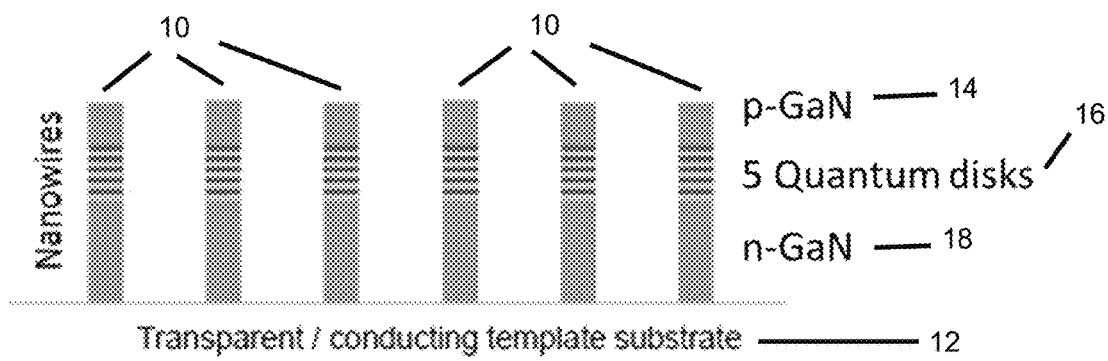
FIG. 1 illustrates a conceptual rendering of a GaN/InGaN-based nanowires structure on a transparent/conducting substrate in accordance with one or more embodiment of the present invention.

FIG. 1 illustrates a schematic illustration of the InGaN-based nanowires structure on a transparent-conducting substrate or template substrate. In this schematic, six separated nanowire structures 10 are shown extending generally vertically from the transparent/conducting template substrate 12. Each nanowires structure 10 includes a p-GaN layer 14, a quantum disk layer 16, and n-GaN layer 18. In this example, quantum disk layer 16 includes five (5) quantum disks.

Figure 2A:
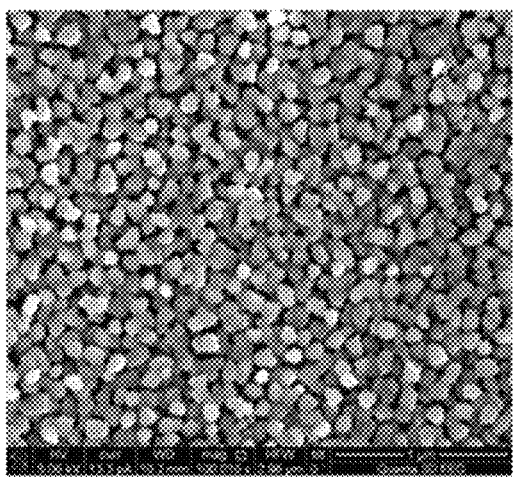
FIGS. 2A-B illustrate scanning electron micrographs showing plan-view (FIG. 2a) and elevation view (FIG. 2b) of a nanowires structure.
Figure 2B:
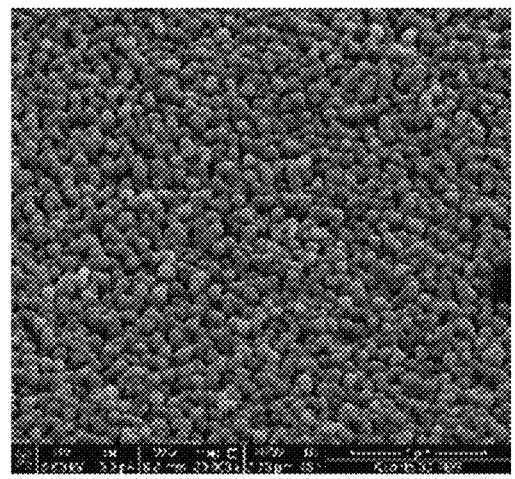

FIGS. 2a and 2b provide scanning electron micrographs showing that the high-density nanowire array develops almost perpendicular to the substrate along the c-direction of GaN, typical of GaN nanowire grown using PA-MBE. FIG. 2a is a plan view of the nanowires array. FIG. 2b is an elevational view of the nanowires array. The nanowires array has an average diameter of ~100 nm and average length of ~300 nm. The density of the nanowires array is approximately $9 \times 10^9$ cm$^{-2}$ with a fill factor of 78%. Each nanowire shows a tapered morphology with a narrow base and broad topside, attributed to a temperature gradient along the nanowire. Thus, as the growth progresses, lateral growth is favored over axial growth.

Figure 3:
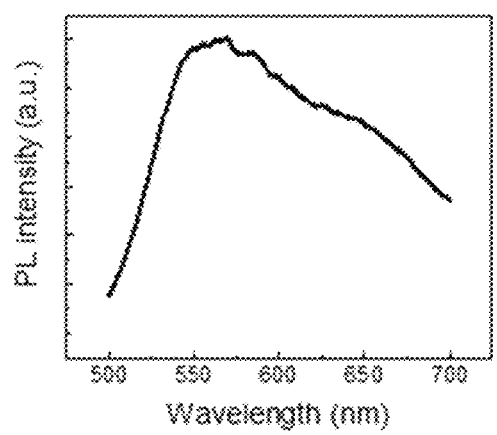
FIG. 3 illustrates a photoluminescence (PL) spectrum of one embodiment of an InGaN-based nanowires structure on a transparent/semitransparent conducting template substrate, realized using TiN interlayer and quartz substrate.
Figure 4:
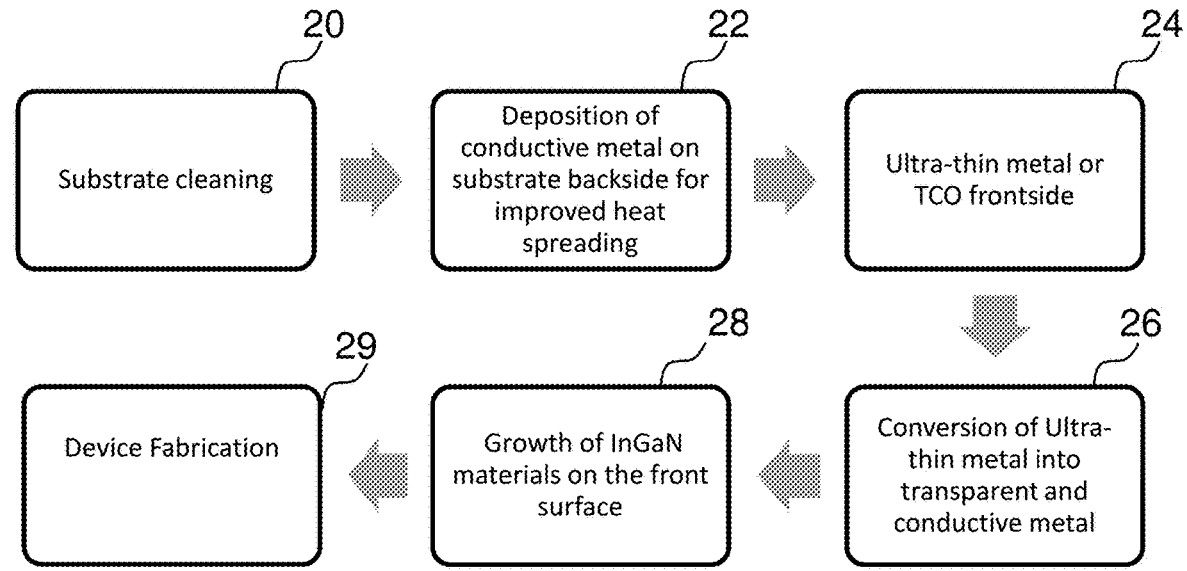
FIG. 4 illustrates general processing steps for nanowires growth.

In one example, light emission spectra of the InGaN-based nanowire were collected using a confocal micro-Raman spectrometer. A solid state laser of 473 nm wavelength was used as the excitation source. The laser beam was focused using a 50× objective with numeric aperture NA=0.5, and spot size of about 1.5 µm. PL spectra, shown in FIG. 3, shows a broad peak centered around 570 nm at room temperature. The broad emission wavelength is a common feature among III-Nitride materials due to structural and compositional inhomogeneity FIG. 4 illustrates general processing steps for nanowires growth. In general terms the processing includes substrate cleaning 20, deposition of heat-conductive metal on substrate backside 22, ultra-thin metal or TCO on frontside 24, conversion of ultra-thin metal into transparent conductive metal 26, growth of InGaN materials on the front side 28, and device fabrication 29.

Figure 5:
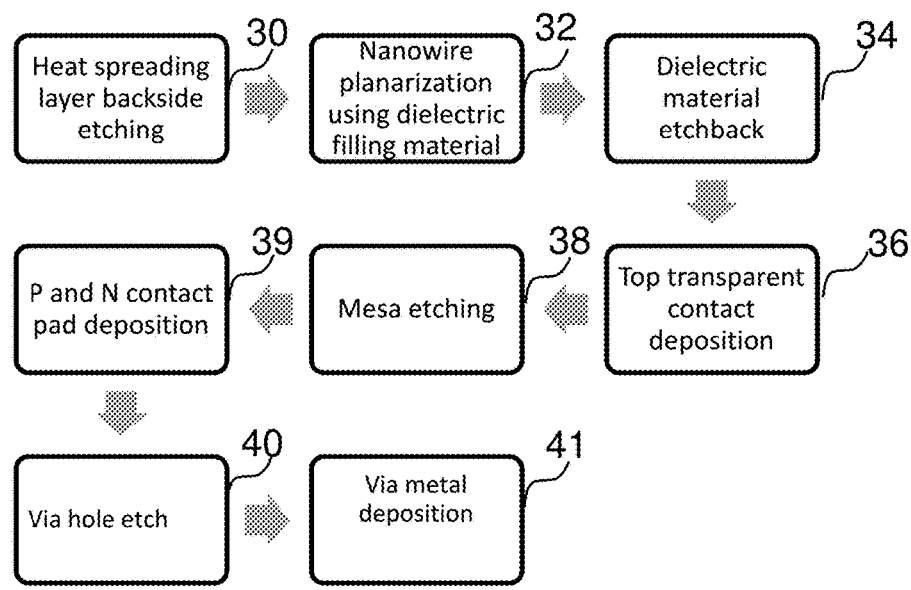
FIG. 5 illustrates general processing steps for nanowires-LED fabrication.

FIG. 5 illustrates general processing steps for light emitting diode formation. In general terms the processing includes heat spreading layer backside etching 30, nanowire planarization 32, dielectric material etchback 34, top transparent contact deposition 36, mesa etching 38 and P- and N-contact pad deposition 39, via-hole etching 40, and via metal deposition 41.

Figure 6:
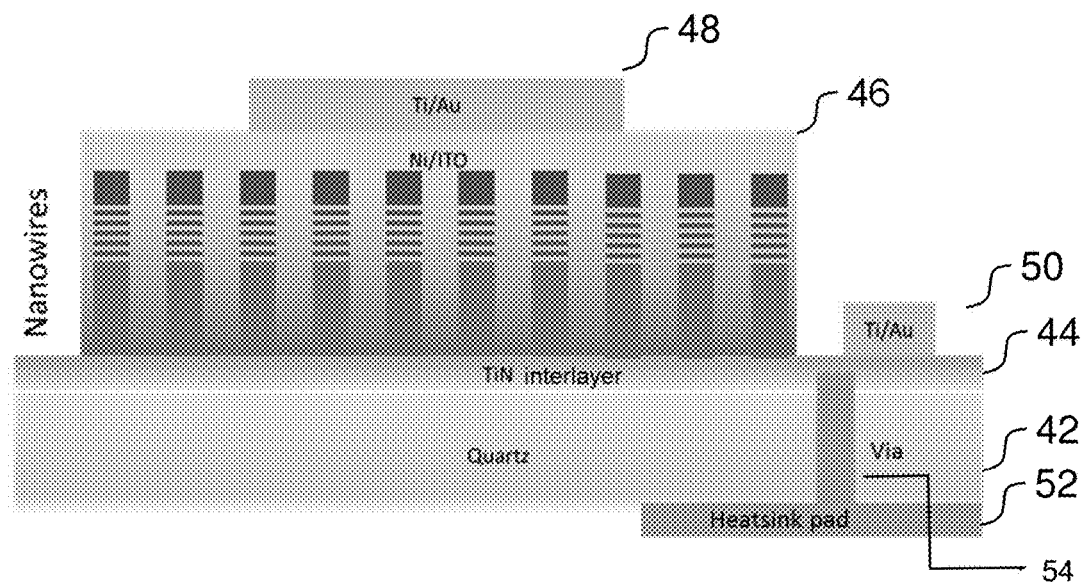
FIG. 6 illustrates a schematic of a nanowires-LED fabricated on a transparent/semitransparent conducting quartz substrate.

FIG. 6 illustrates a schematic of a nanowire light emitting device fabricated on a transparent quartz substrate 42. Other components of the device include semitransparent conducting interlayer 44, transparent contact 46, P-contact 48 and N-contact 50. The semitransparent conducting layer 44 may comprise a thin metal layer, ITO, ZTO, graphene, etc. The device can also include a heatsink pad 52 connecting the substrate backside to the device layer through a via hole 54.

Figure 7:
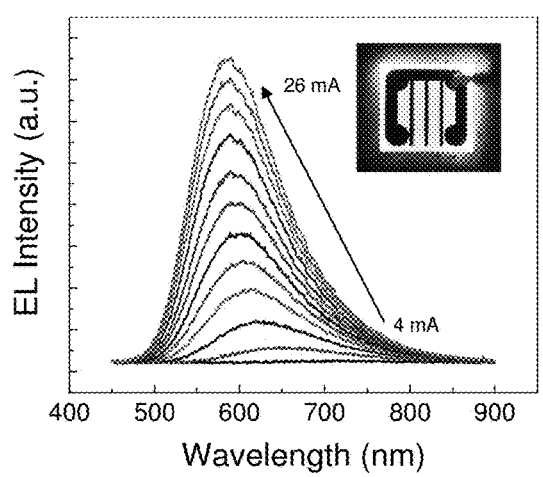
FIG. 7 illustrates light characteristics and EL spectra of one example of a nanowires-LED structure in accordance with the present disclosure.

FIGS. 7 through 11 illustrate performance characteristics of one embodiment of the present disclosure utilizing a nanowires-based LED. FIG. 7 illustrates light characteristics and electroluminescence (EL) spectra of a nanowires-based LED as measured under direct current (DC) injection using a microscope based EL system integrated with a Keithley 2400 source meter, a Newport power meter (model 2936-C) and an Ocean Optics HR4000 spectrometer.

Figure 8:
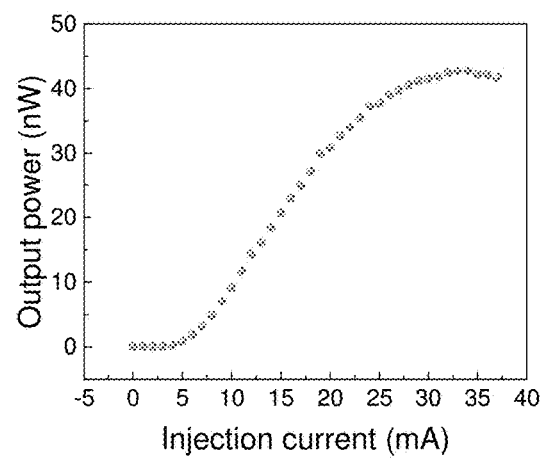
FIG. 8 illustrates device emission spectra under different injection currents
Figure 9:
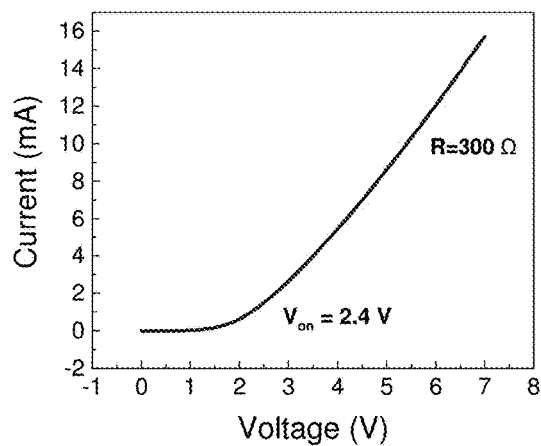
FIG. 9 illustrates current and voltage characteristics.
Figure 10:
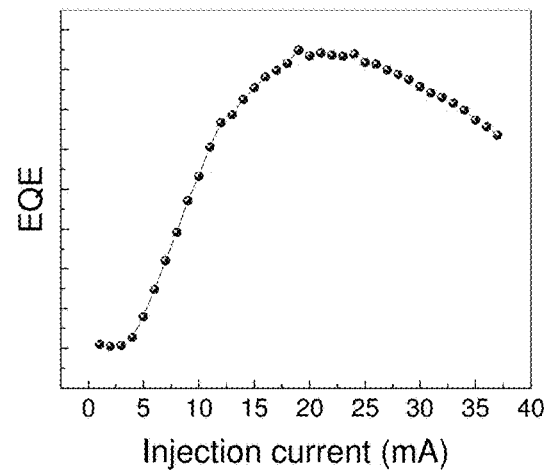
FIG. 10 illustrates calculated relative external quantum efficiency (EQE) as relating to injection current.
Figure 11:
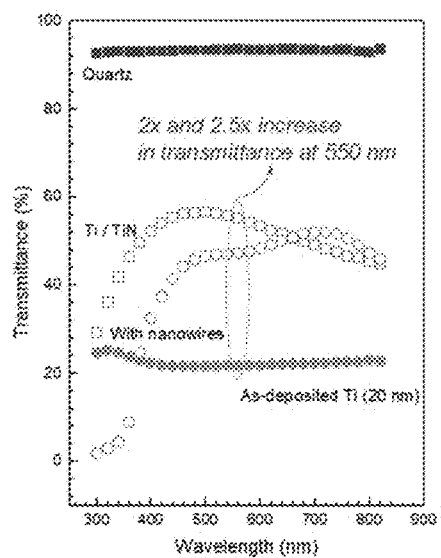
FIG. 11 illustrates transmissivity of NW grown on various substrates as relating to wavelength.

FIG. 8 illustrates device emission spectra under different injection currents, with device output power ranging from 0 nW to about 40 nW. FIG. 9 illustrates current and voltage characteristics of the device. FIG. 10 illustrates calculated relative external quantum efficiency (EQE) of the device as relating to injection current. FIG. 11 illustrates transmissivity of various substrates as relating to wavelength measured using Shimadzu UV-3600 UV-vis-NIR spectrophotometer. In FIG. 11, the transmittance for quartz, Ti/TiN, nanowires, and as-deposited. Ti (20 nm) is compared. Notably, a 2× and 2.5× increase in transmittance at 550 nm exists for Ti/TiN and nanowires structures, respectively, as compared to the as-deposited Ti structure.

The transparent glass substrate, such as quartz substrate 42 in FIG. 6, may also include amorphous glass, quartz, and fused silica. The wavelengths of the NW light emitter grown on a transparent substrate may cover the ultraviolet regime, the visible regime, and the infrared regime.

The foregoing description of various preferred embodiments of the disclosure have been presented for purposes of illustration and description. It is not intended to be exhaustive or to limit the disclosure to the precise embodiments, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto. Various examples have been described. These and other examples are within the scope of the following claims.

Other embodiments of the present disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of this disclosure. It should be understood that various features and aspects of the disclosed embodiments can be combined with or substituted for one another in order to form various embodiments. Thus, it is intended that the scope of at least some of the present disclosure should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A transparent optoelectronic device, comprising:
   a GaN/InGaN nanowires-LED with embedded InGaN quantum-disks grown on a metallic interlayer predeposited on a substrate, said nanowires-LED emitting light at a visible wavelength and including individual nanowire structures spaced apart to maintain transparency of the optoelectronic device through said substrate, metallic interlayer, and nanowires-LED, and said metallic interlayer being transparent or partially transparent and conducting, and with said substrate being transparent or partially transparent to ultra-violet light, visible light or infrared light;
   a transparent metal contact formed atop of said nanowires-LED, with transparency of the optoelectronic device maintained across said substrate, metallic interlayer, nanowires-LED, and transparent metal contact, and
   a P-contact pad formed atop of said transparent metal contact, and a N-contact pad formed atop of said metallic interlayer.

2. The optoelectronic device of claim 1, wherein the substrate is transparent glass.

3. The optoelectronic device of claim 2, wherein the transparent glass includes one or more of amorphous glass, quartz, fused silica, and chalcogenide glass.

4. The optoelectronic device of claim 1, wherein the metallic interlayer is positioned between the nanowires-LED and the substrate.

5. The optoelectronic device of claim 1, wherein the metallic interlayer is positioned between a component of the nanowires-LED and the substrate thus forming a transparent and conducting template substrate.

6. The optoelectronic device of claim 1, wherein the metallic interlayer has wavelength-dependent transparency.

7. The optoelectronic device of claim 1, wherein the metallic interlayer is fabricated through exposure of ultra-thin metal layer to a nitrogen species or incorporation of photonic bandgap structures, thereby achieving a wavelength dependent transparency property.

8. The optoelectronic device of claim 1, wherein the metallic interlayer has varying degrees of transparency depending on the operating wavelength.

9. The optoelectronic device of claim 1, wherein the nanowires-LED is grown directly on the metallic interlayer, supported by the substrate.

10. The optoelectronic device of claim 9, wherein the metallic interlayer is converted prior to growth of the nanowires-LED structure thereby achieving a wavelength dependent transparency property.

11. A transparent optoelectronic device, comprising:
    a substrate which is transparent or partially transparent to ultra-violet light, visible light or infrared light;
    a conducting metallic interlayer deposited on the substrate, with said interlayer being transparent or partially transparent; and
    a GaN/InGaN nanowires-LED with embedded InGaN quantum-disks grown on the metallic interlayer, with said nanowires-LED emitting light at a visible wavelength and including individual nanowire structures spaced apart to maintain transparency of the optoelectronic device through said substrate, metallic interlayer, and nanowires-LED,
    a transparent metal contact formed atop of said nanowires-LED, with transparency of the optoelectronic device maintained across said substrate, metallic interlayer, nanowires-LED, and transparent metal contact, and
    a P-contact pad formed atop of said transparent metal contact, and a N-contact pad formed atop of said metallic interlayer.

12. The optoelectronic device of claim 11, wherein the substrate is transparent glass.

13. The optoelectronic device of claim 12, wherein the transparent glass includes one or more of amorphous glass, quartz, fused silica, and chalcogenide glass.

14. The optoelectronic device of claim 11, wherein the metallic interlayer has a wavelength-dependent transparency.

15. The optoelectronic device of claim 14, wherein the metallic interlayer is fabricated through exposure of ultra-thin metal layer to a nitrogen species or incorporation of photonic bandgap structures, thereby achieving the wavelength-dependent transparency.

16. The optoelectronic device of claim 14, wherein transmissive properties of the metallic interlayer are tunable during epitaxial growth of the nanowires-LED.

* * * * *